(12) United States Patent
Oh et al.

(10) Patent No.: US 9,841,686 B2
(45) Date of Patent: Dec. 12, 2017

(54) EXPOSURE METHOD, EXPOSURE DEVICE FOR PERFORMING THE METHOD AND MANUFACTURING METHOD OF DISPLAY SUBSTRATE USING THE METHOD

(71) Applicant: SAMSUNG DISPLAY CO., LTD., Yongin, Gyeonggi-Do (KR)

(72) Inventors: Ik-Han Oh, Cheonan-si (KR); Seung-Kyu Lee, Cheonan-si (KR); Hyeon-Min Cho, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 147 days.

(21) Appl. No.: 14/740,743

(22) Filed: Jun. 16, 2015

(65) Prior Publication Data

US 2016/0187790 A1    Jun. 30, 2016

(30) Foreign Application Priority Data

Dec. 29, 2014 (KR) .......................... 10-2014-0192085

(51) Int. Cl.
*G03F 7/20* (2006.01)
*G03F 9/00* (2006.01)

(52) U.S. Cl.
CPC ........ *G03F 7/70633* (2013.01); *G03F 9/7003* (2013.01)

(58) Field of Classification Search
CPC .......................... G03F 7/70633; G03F 9/7003
USPC ..................... 430/22, 30, 313, 394
See application file for complete search history.

(56) References Cited

U.S. PATENT DOCUMENTS

| | | | |
|---|---|---|---|
| 7,190,824 B2* | 3/2007 | Chen | G03F 7/70633 257/797 |
| 7,271,905 B2* | 9/2007 | Smith | G03F 7/70558 356/401 |

FOREIGN PATENT DOCUMENTS

| | | |
|---|---|---|
| KR | 100724186 | 5/2007 |
| KR | 1020090008268 | 1/2009 |
| KR | 1020140062600 | 5/2014 |
| KR | 1020140074124 | 6/2014 |

* cited by examiner

*Primary Examiner* — Christopher Young
(74) *Attorney, Agent, or Firm* — F. Chau & Associates, LLC

(57) ABSTRACT

An exposure method includes exposing a substrate to form a first pattern on a first layer, measuring a first alignment value of the first pattern, generating first correction data by using the first alignment value, storing the first correction data and exposing the substrate to form a second pattern on a second layer disposed on the first layer by using the first correction data.

18 Claims, 8 Drawing Sheets

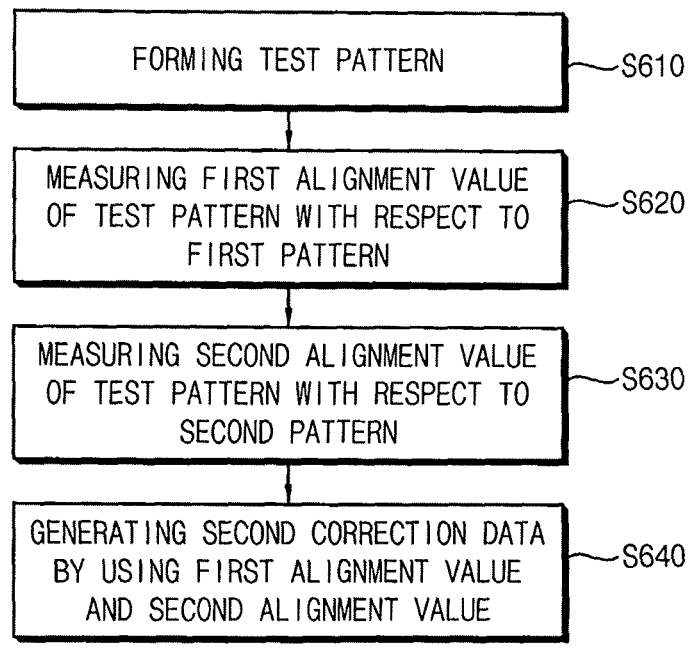
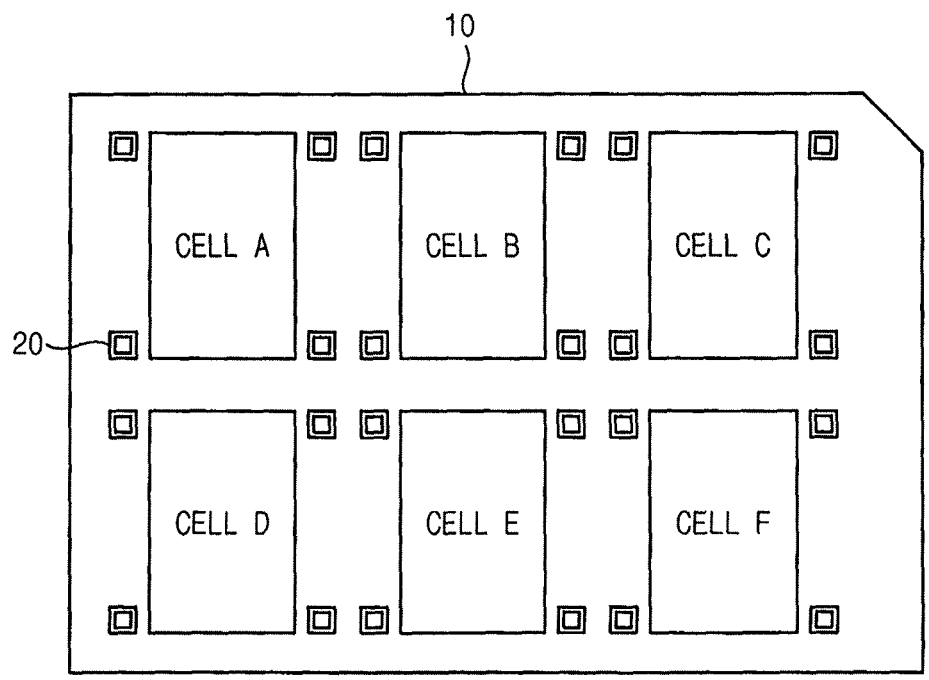

EXPOSURE METHOD, EXPOSURE DEVICE FOR PERFORMING THE METHOD AND MANUFACTURING METHOD OF DISPLAY SUBSTRATE USING THE METHOD

CROSS-REFERENCE TO RELATED APPLICATIONS

This application claims priority under 35 U.S.C. §119 to Korean Patent Application No. 10-2014-0192085, filed on Dec. 29, 2014 in the Korean Intellectual Property Office KIPO, the disclosure of which are incorporated by reference in their entireties herein.

BACKGROUND

1. Technical Field

Exemplary embodiments of the present inventive concept relate to an exposure method, an exposure device for performing the exposure method and a method of manufacturing a display substrate using the exposure method.

2. Discussion of Related Art

Generally, a liquid crystal display (LCD) device includes an LCD panel including a thin-film transistor (TFT) substrate, a color filter substrate facing the TFT substrate, and a liquid crystal layer disposed between the TFT substrate and the color filter substrate.

The TFT substrate and the color filter substrate include multiple layers manufactured via a photolithographic process, an exposing process and a developing process.

The exposing process is performed by applying light to (e.g., irradiating) a photoresist layer formed on a substrate through a separate photo mask having a regular pattern. For example, the light reacts with the photoresist layer of the substrate so that the photoresist layer is patterned according to the pattern formed on the photo mask.

As the size of the LCD device increases, a size of an irradiation area and a size of a photo mask may be limited. Thus, the exposing process is performed by scanning a substrate that is divided into a plurality of exposing areas using a plurality of expose devices. However, when an exposure device is misaligned with an exposing area, a defect in the resulting LCD device may occur.

SUMMARY

At least one exemplary embodiment of the present inventive concept provides an exposure method capable of increasing productivity.

At least one exemplary embodiment of the present inventive concept further provides an exposure device for performing the exposure method.

At least one exemplary embodiment of the present inventive concept further provides a method of manufacturing a display substrate using the exposure method.

In an exemplary embodiment of the inventive concept, a method of exposing a substrate includes exposing a substrate to form a first pattern on a first layer, measuring a first alignment value of the first pattern, generating first correction data by using the first alignment value, storing the first correction data and exposing the substrate to form a second pattern on a second layer disposed on the first layer by using the first correction data.

In an exemplary embodiment, the first alignment value may be measured by using an alignment pattern formed by the same process as the first pattern.

In an exemplary embodiment, the first correction data may be a data for exposing a substrate using the same alignment value as the first alignment value to form a second pattern.

In an exemplary embodiment, the method may further include generating second correction data, storing the second correction data and exposing the substrate to form a third pattern on a third layer disposed on the second layer by using the second correction data.

In an exemplary embodiment, generating the second correction data may include forming a test pattern on the third layer, measuring a second alignment value of the test pattern with respect to the first pattern, measuring a third alignment value of the test pattern with respect to the second pattern and generating a second correction data by using the second alignment value and the third alignment value.

In an exemplary embodiment, the second correction data may be defined by the following Equation. D2=A×DV1+ (1-A)×DV2. The D2 may be the second correction data. The DV1 may be a first correction value of the test pattern with respect to the first pattern. The DV2 may be a second correction value of the test pattern with respect to the second pattern. The parameter A may be a numerical variable.

In an exemplary embodiment, the first correction value may be calculated by using a difference between a target alignment value of the third pattern with respect to the first pattern and an alignment value of the test pattern with respect to the first pattern. The second correction value may be calculated by using a difference between a target alignment value of the third pattern with respect to the second pattern and an alignment value of the test pattern with respect to the second pattern.

In an exemplary embodiment of the inventive concept, an exposure device includes a light source part configured to apply light to a substrate, a mask disposed between the light source part and the substrate, a measuring part configured to measure a first alignment value of a first pattern formed on a first layer of the substrate and a data storage part configured to store first correction data generated by using the first alignment value. The first correction data is generated by using the first alignment value, and a second pattern is formed on a second layer disposed on the first layer by using the first correction data.

In an exemplary embodiment, the measuring part may measure the first alignment value of an alignment pattern formed by the same process as the first pattern.

In an exemplary embodiment, the first correction data may be a data for exposing a substrate using the same alignment value as the first alignment value to form the second pattern.

In an exemplary embodiment, second correction data may be generated and stored in the data storage part. A third pattern may be formed on a third layer disposed on the second layer by using the second correction data.

In an exemplary embodiment, generating the second correction data may include forming a test pattern on the third layer, measuring a second alignment value of the test pattern with respect to the first pattern, measuring a third alignment value of the test pattern with respect to the second pattern and generating the second correction data by using the second alignment value and the third alignment value.

In an exemplary embodiment, the second correction data may be defined by the following Equation. D2=A×DV1+ (1-A)×DV2. The D2 may be the second correction data. The DV1 may be a first correction value of the test pattern with respect to the first pattern. The DV2 may be a second correction value of the test pattern with respect to the second pattern. The parameter A may be a numerical variable.

In an exemplary embodiment, the first correction value may be calculated by using a difference between a target alignment value of the third pattern with respect to the first pattern and an alignment value of the test pattern with respect to the first pattern. The second correction value may be calculated by using a difference between a target alignment value of the third pattern with respect to the second pattern and an alignment value of the test pattern with respect to the second pattern.

In an exemplary embodiment of the inventive concept, a method of manufacturing a display substrate includes forming a gate pattern on a substrate, measuring a first alignment value of the gate pattern, generating first correction data by using the first alignment value and exposing the substrate to form a data pattern on the substrate by using the first correction data.

In an exemplary embodiment, the first alignment value may be measured by using an alignment pattern formed by the same process as the gate pattern.

In an exemplary embodiment, first correction data may be a data for exposing a substrate using the same alignment value as the first alignment value to form the data pattern.

In an exemplary embodiment, the method may further include generating second correction data, storing the second correction data and exposing the substrate to form a pixel electrode on the substrate by using the second correction data.

In an exemplary embodiment, generating the second correction data may include forming a test pattern on the substrate, measuring a second alignment value of the test pattern with respect to the gate pattern, measuring a third alignment value of the test pattern with respect to the data pattern and generating a second correction data by using the second alignment value and the third alignment value.

In an exemplary embodiment, the second correction data may be defined by the following Equation. $D2=A\times DV1+(1-A)\times DV2$. The D2 may be the second correction data. The DV1 may be a first correction value of the test pattern with respect to the gate pattern. The DV2 may be a second correction value of the test pattern with respect to the data pattern.

According to an exemplary embodiment of the inventive concept, a data metal pattern is formed by using a first correction data corresponding to the alignment state of the gate metal pattern. The data metal pattern is formed according to the gate metal pattern. Therefore, although the gate metal pattern is formed misaligned with a mother substrate, the data metal pattern is aligned with the gate metal pattern precisely. Thus, defects of a display device may be decreased.

In addition, the second correction data may be a value from the first correction value to the second correction value. Thus, when a plurality of patterns are disposed on a plurality of layers, each pattern disposed on each layer may be aligned precisely with each other. Accordingly, all patterns may be aligned precisely, and thus defects of a display device may be decreased.

In an exemplary embodiment of the inventive concept, a method of manufacturing a display substrate includes forming a gate electrode on a substrate, a measuring part attached to an exposure device determining a first alignment value indicating a degree of alignment between the gate electrode and an alignment pattern on the substrate, generating first correction data from the first alignment value, and adjusting the exposure device to apply light to the substrate using the first correction data to generate a drain electrode on the substrate.

In an exemplary embodiment, the method may include forming a test pattern on the substrate, the measuring part determining a second alignment layer indicating a degree of alignment between the test pattern and the gate electrode, the measuring part determining a third alignment value indicating a degree of alignment between the test pattern and the drain electrode, generating second correction data by using the second alignment value and the third alignment value, and adjusting the exposure device using the second correction data to generate a pixel electrode

BRIEF DESCRIPTION OF THE DRAWINGS

The present inventive concept will become more apparent by describing in detailed exemplary embodiments thereof with reference to the accompanying drawings, in which:

FIG. 3 is a block diagram illustrating an exposure method according to an exemplary embodiment of the inventive concept;

FIG. 4 is a plan view illustrating a mother substrate according to an exemplary embodiment of the inventive concept;

DETAILED DESCRIPTION

Hereinafter, the present invention will be explained in detail with reference to the accompanying drawings.

Figure 1:
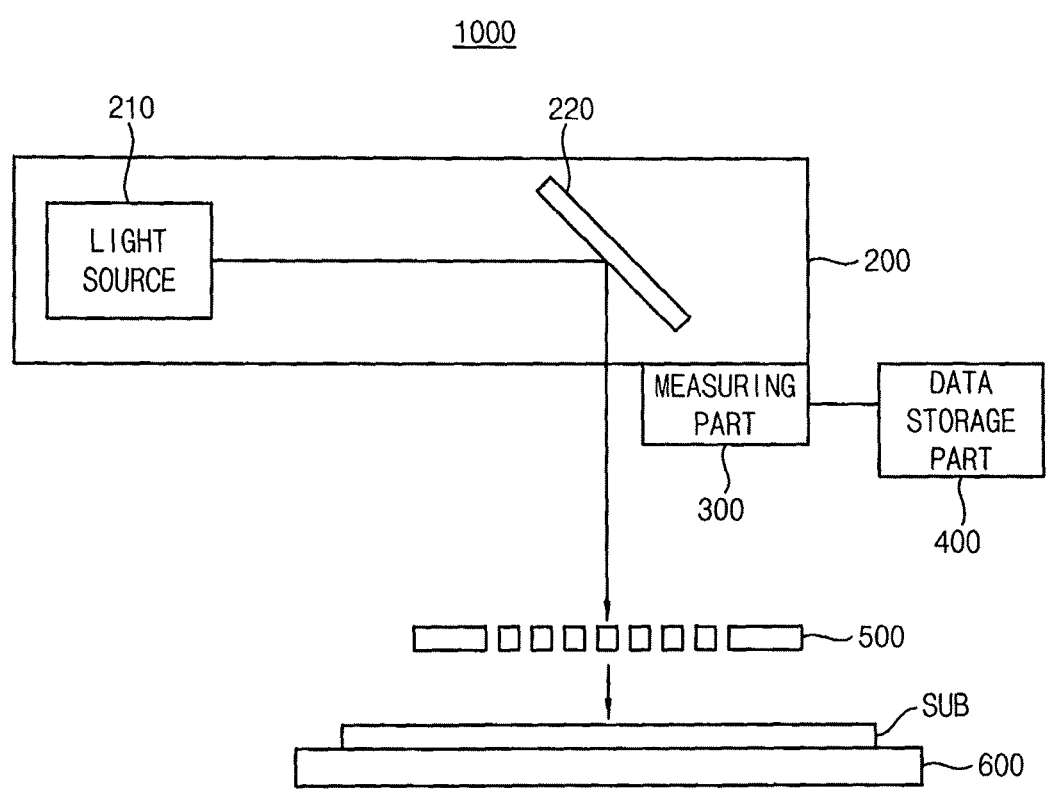
FIG. 1 is a block diagram illustrating an exposure device according to an exemplary embodiment of the inventive concept.

FIG. 1 is a block diagram illustrating an exposure device according to an exemplary embodiment of the inventive concept. However, the inventive concept may be embodied in different forms and should not be construed as limited to the embodiments set forth herein. In the drawing figures, the thickness of layers and regions may be exaggerated for clarity. It will be understood that when an element is referred to as being "on" or "connected to" another element or layer, it can be directly on or connected to the other element or layer, or one or more intervening elements may also be present. Like reference numerals refer to like elements throughout. The use of the terms "a" and "an" in the context of the inventive concept are to be construed to cover both the singular and the plural, unless otherwise indicated herein or clearly contradicted by context.

Referring to FIG. 1, an exposure device 1000 according to an exemplary embodiment of the inventive concept includes a light source part 200, a measuring part 300, a data storage part 400, a mask 500 and a stage 600.

The light source part 200 includes a light source 210 and a concentrator 220. The light source 210, for example, may include an yttrium aluminum garnet (YAG) laser and a mercury lamp. A photoresist layer reacted with first light provided by the light source part 200 is formed on the substrate SUB. In an exemplary embodiment, the photoresist layer includes a photosensitive polymer composition.

The concentrator 220 concentrates the light from the light source 210. For aiding in concentrating a sufficient amount of light, the concentrator 220 may include at least one reflective lens. The first light reflected by the concentrator 220 is applied to the substrate SUB, which is transferred by the stage 600.

In an exemplary embodiment, the substrate SUB is one of a thin-film transistor (TFT) substrate and a color filter substrate which are components of a liquid crystal display (LCD) panel displaying an image in an LCD apparatus. The TFT substrate includes a TFT as a switching element. The TFT having a matrix pattern and a thin film shape may be formed on a glass substrate. The color filter substrate may include a red color pixel, a green color pixel and a blue color pixel. The color pixels having thin film shapes may be formed on a glass substrate.

The measuring part 300 may be mounted in the exposure device 1000. The measuring part 300 measures an alignment value of a first pattern formed on a first layer of the substrate SUB. The alignment value may be measured by using alignment patterns formed by the same process as the first pattern. The alignment pattern may have a frame shape. However, the present inventive concept is not limited thereto. The alignment pattern may have a "+" shape or a bar shape. A correction data may be generated by using the alignment value measured by the measuring part 300.

The correction data generated by using the alignment value may be stored in the data storage part 400. When a second pattern is formed on a second layer disposed on the first layer, correction data stored in the data storage part 400 may be used. That is, data concerning the alignment value of the first patterns formed on the first layer are stored. Thereafter, when the second pattern is formed, the second pattern may be formed by using the same value as the alignment value of the first patterns. Thus, the first patterns and the second patterns may be formed using the same alignment value. Accordingly, the second pattern may be aligned with the first pattern more precisely, and thus defects of a display device may be decreased.

The mask 500 may be manufactured as a shape corresponding to a shape of a pattern formed on the substrate SUB. The mask 500 may include a light-transmission region and a light-blocking region. However, the present inventive concept is not limited thereto. The mask 500 may have a light-blocking region and a transflective region.

The substrate SUB is fixed to the stage 600. The stage 600 may have a fixed structure or a moving structure according to an exposure type. When stage 600 has a moving structure, the exposure device 1000 may further include a transfer control part (not shown). The transfer control part outputs a transfer signal which transfers or moves the stage 600.

Figure 2:
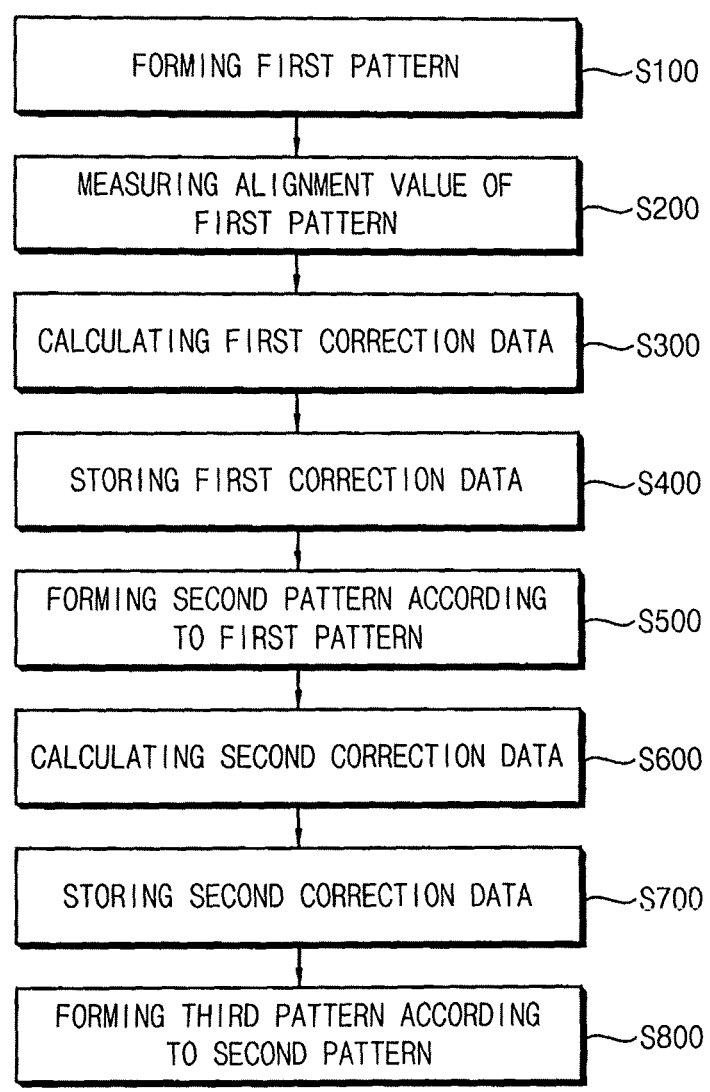
FIG. 2 is a block diagram illustrating an exposure method according to an exemplary embodiment of the inventive concept.

FIG. 2 is a block diagram illustrating an exposure method according to an exemplary embodiment of the inventive concept. FIG. 3 is a block diagram illustrating an exposure method according to an exemplary embodiment of the inventive concept. FIG. 4 is a plan view illustrating a mother substrate according to an exemplary embodiment of the inventive concept. FIGS. 8 to 12 are cross-sectional views illustrating a method of manufacturing the display substrate according to an exemplary embodiment of the inventive concept.

Referring to FIG. 2, an exposure method according to an exemplary embodiment of the inventive concept includes forming a first pattern on a first layer S100, measuring a first alignment value of the first pattern S200, generating first correction data by using the first alignment value S300, storing the first correction data S400, forming a second pattern on a second layer disposed on the first layer by using the first correction data S500, generating a second correction data S600, storing the second correction data S700 and forming a third pattern on a third layer disposed on the second layer by using the second correction data S800.

In the process of forming a first pattern on a first layer S100, a first pattern is formed on the first layer. For example, the first pattern may be a gate metal pattern. In the process of forming a first pattern, an alignment pattern is formed simultaneously. The alignment pattern may be disposed between cells of a mother substrate.

In the process of measuring a first alignment value of the first pattern S200, the first alignment value is measured by using alignment patterns formed by the same process as the first pattern.

Figure 5:
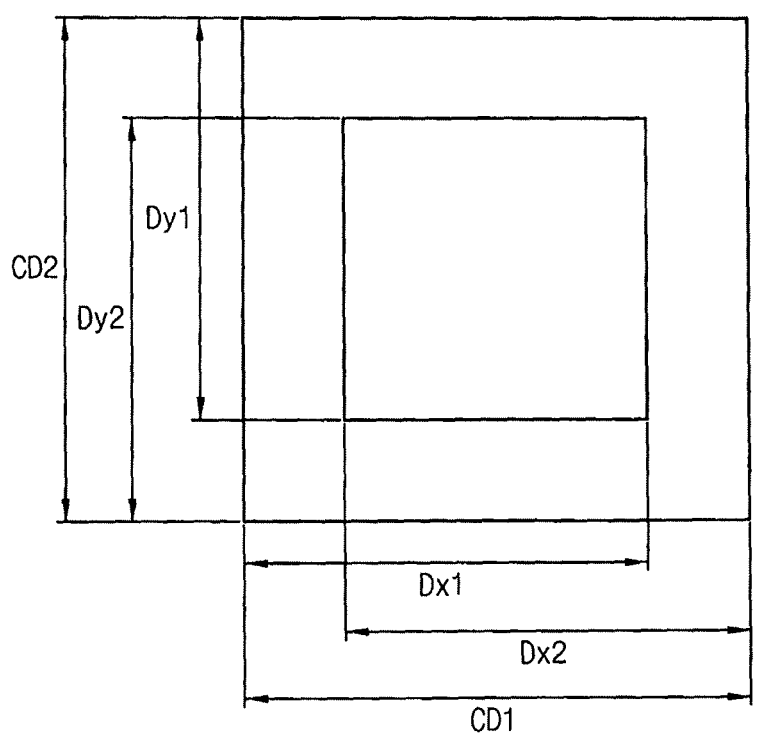
FIG. 5 is a plan view magnifying an alignment pattern of FIG. 4.

Referring to FIGS. 4 and 5, a mother substrate 10 according to an exemplary embodiment of the inventive concept may include an alignment pattern 20 disposed between cells of a mother substrate 10.

The alignment pattern 20 is formed by the same process as the first pattern. For example, the first pattern may be a gate metal pattern. The alignment pattern 20 may be disposed on the same layer as the gate metal pattern. Since the first pattern and the alignment pattern 20 are formed simultaneously, an alignment state may be identified by measuring a width of the alignment pattern 20.

The alignment pattern 20 may have a frame shape. For example, a frame shape may include outer edges formed into a rectangle of a first perimeter and inner edges formed into a rectangle of a second perimeter smaller than the first perimeter. Parameter CD1 may be used to describe the horizontal width of the alignment pattern 20 and parameter CD2 may be used to describe the vertical width of the alignment pattern 20. When an alignment value of an X-component extending in a horizontal direction is measured, a first sub-X-width Dx1 and a second sub-X-width Dx2 are measured. The first sub-X-width Dx1 may correspond to the distance between a first outer vertical edge of the frame shape and a farthest opposing first inner vertical edge of the frame shape. The second sub-X-width Dx2 may correspond to the distance between a second inner vertical edge of the frame shape opposing the first inner vertical edge and a second outer vertical edge of the frame shape opposing the first outer vertical edge. Thereafter, an alignment value of the X-component is calculated by using the first sub-X-width Dx1 and the second sub-X-width Dx2. That is, an alignment value of the X-component is calculated by using a difference of a width of the X-component of the alignment pattern 20 and the first sub-X-width Dx1 and a difference of a width of the X-component of the alignment pattern 20 and the second sub-X-width Dx2. For example, the alignment value of the X-component may be calculated by subtracting Dx1 from CD1, and subtracting Dx2 from CD1.

When an alignment value of a Y-component extending in a vertical direction is measured, a first sub-Y-width Dy1 and a second sub-Y-width Dy2 are measured. The first sub-Y-width Dy1 may correspond to the distance between a first outer horizontal edge of the frame shape and a farthest opposing first inner horizontal edge of the frame shape. The second sub-Y-width Dy2 may correspond to the distance between a second inner horizontal edge of the frame shape opposing the first inner horizontal edge and a second outer horizontal edge of the frame shape opposing the first outer horizontal edge. Thereafter, an alignment value of the Y-component is calculated by using the first sub-Y-width Dy1 and the second sub-Y-width Dy2. That is, an alignment value of the Y-component is calculated by using a difference of a width of the Y-component of the alignment pattern 20 and the first sub-Y-width Dy1 and a difference of a width of the Y-component of the alignment pattern 20 and the second sub-Y-width Dy2. For example, the alignment value of the Y-component may be calculated by subtracting Dy1 from CD2, and subtracting Dy2 from CD2.

In the process of generating a first correction data by using the first alignment value S300, a first correction data is generated by using the first alignment value. The first alignment value may include an alignment value of the X-component and an alignment value of Y-component.

The first correction data is data for exposing a substrate using the same alignment value as the first alignment value to form a second pattern. Thus, the first correction data is generated by using an alignment value of the first pattern. Since, the second pattern is formed by using the first correction data, the second pattern can be aligned with the first pattern more precisely. The first correction data may include a correction value of an X-component and a correction value of a Y-component. Thus, the second pattern may be aligned more precisely with the first pattern using an alignment state of the X-component of the first pattern and the alignment state of the Y-component of the first pattern. In an exemplary embodiment, these alignment states are used to adjust (e.g., move) the position of the stage 600 relative to the mask 500 to a new position prior to irradiation by the light source 200 of a next layer on the substrate. For example, the stage 600 can be moved in a horizontal direction and/or a vertical direction using alignment values derived from these alignment states before the light source 200 irradiates the substrate to form another pattern. In an exemplary embodiment, the mask 500 or the light source 200 is moved to a new position in a horizontal direction and/or a vertical direction using the alignment values prior to irradiation by the light source 200 to form another pattern. In an exemplary embodiment, the angle of the concentrator 220 is adjusted based on the alignment values prior to irradiation by the light source 200 to form another pattern.

In the process of storing the first correction data S400, the first correction data is stored in the data storage part 400. The first correction data stored in the date storage part 400 may be used for forming the second pattern.

In the process of forming a second pattern on a second layer disposed on the first layer by using the first correction data S500, the second pattern is formed according to the first correction data stored in the data storage part 400. The first correction data is data for exposing a substrate using the same alignment value as the first alignment value to form a second pattern. The first correction data may include a correction value of an X-component and a correction value of a Y-component.

For example, the first pattern may be a gate metal pattern. An alignment value of the gate metal pattern is measured. Thereafter, a first correction data is generated by using the alignment value of the gate metal pattern. The first correction data is stored in the data storage part 400 to be used for forming the second pattern. The second pattern may be a data metal pattern. The data metal pattern may include a data line, a source electrode and a drain electrode. Thus, a data metal pattern corresponding to an alignment state of the gate metal pattern may be formed.

In an exemplary embodiment, a data metal pattern is formed by using first correction data corresponding to the alignment state of the gate metal pattern. The data metal pattern is formed according to the gate metal pattern. Therefore, although the gate metal pattern is formed misaligned with a mother substrate, the data metal pattern can be aligned with the gate metal pattern more precisely. Thus, defects of a display device may be decreased.

In the process of generating a second correction data S600, second correction data is generated by using the first pattern disposed on a first layer and the second pattern disposed on a second layer.

Referring to FIG. 3, generating the second correction data S600 includes forming a test pattern on the third layer disposed on the second layer S610, measuring a first alignment value of the test pattern with respect to the first pattern S620, measuring a second alignment value of the test pattern with respect to the second pattern S630 and generating a second correction data by using the first alignment value and the second alignment value S640.

In the process of forming a test pattern on the third layer disposed on the second layer S610, the test pattern is formed on the third layer. For example, the test pattern may be a pixel electrode. In addition, the first pattern may be a gate metal pattern and the second pattern may be a data metal pattern. After the test pattern is formed, an alignment value of the test pattern is measured.

Figure 8:
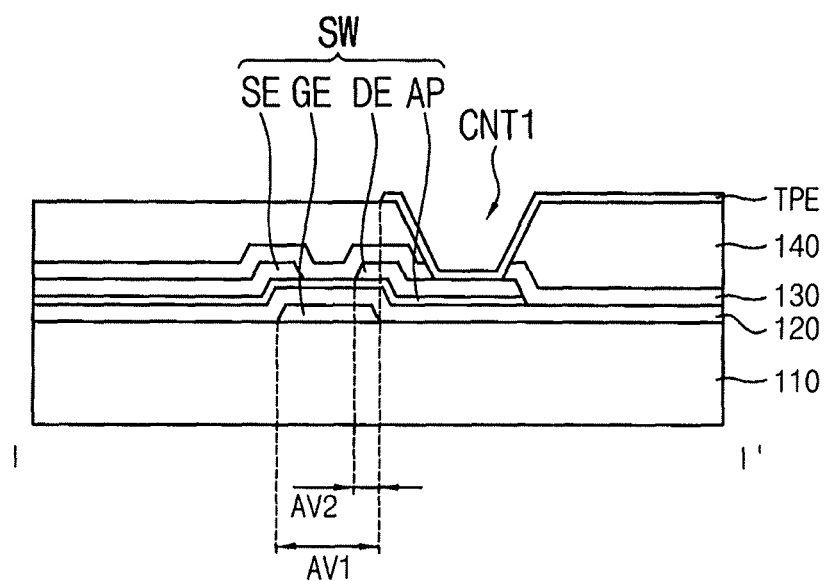
FIGS. 8 to 12 are cross-sectional views illustrating a method of manufacturing the display substrate of FIG. 7.

Referring to FIG. 8, a method of measuring an alignment value of the test pattern TPE formed on the third layer is illustrated.

A display substrate 100 according to an exemplary embodiment of the inventive concept includes a base substrate 110, a gate line GL, a data line DL, a gate electrode GE, a source electrode SE, a drain electrode DE, active pattern AP, a pixel electrode PE, a first insulation layer 120, a second insulation layer 130 and an organic layer 140.

Examples of the base substrate 110 may include a glass substrate, a quartz substrate, a silicon substrate, a plastic substrate and the like.

The gate electrode GE is disposed on the base substrate 110. The gate electrode GE is electrically connected with the gate line GL. The gate electrode GE may have a single layer structure including copper (Cu), silver (Ag), chrome (Cr), molybdenum (Mo), aluminum (Al), titanium (Ti), manganese (Mn) and a mixture thereof. In addition, the gate electrode GE may have a multi layer structure having a plurality of layers including materials different each other. For example, the gate electrode GE may include a copper layer and a titanium layer disposed on and/or under the copper layer.

The first insulation layer 120 is formed on the gate electrode GE. The first insulation layer 120 may cover the base substrate 110 and a first conductive pattern including the gate electrode GE. The first insulation layer 120 may include an inorganic material such as silicon oxide ($SiO_x$) and/or silicon nitride ($SiN_x$). For example, the first insulation layer 120 may include silicon oxide ($SiO_x$), and may have a thickness of about 500 Å. In addition, the first insulation layer 120 may include a plurality of layers including different materials from each other.

An active pattern AP is formed on the first insulation layer 120. The active pattern AP is formed on the first insulation layer 120 in an area in which the gate electrode GE is formed. The active pattern AP may be overlapped with the gate electrode GE. The active pattern AP may be partially overlapped with the source electrode SE and the drain electrode DE. The active pattern AP may be disposed between the gate electrode GE and the source electrode SE. The active pattern AP may be disposed between the gate electrode GE and the drain electrode DE. The source electrode SE together with the gate electrode GE, the drain electrode DE, and the active pattern AP form a switching element SW (e.g., a thin film transistor).

The source electrode SE and the drain electrode DE may be formed on the active pattern AP. The source electrode SE and the drain electrode DE may be spaced apart from each other. The source electrode SE and the drain electrode DE may be formed from the same layer as the data line DL.

The source electrode SE and the drain electrode DE may have a single layer structure including copper (Cu), silver (Ag), chrome (Cr), molybdenum (Mo), aluminum (Al), titanium (Ti), manganese (Mn) and a mixture thereof. In addition, the source electrode SE and the drain electrode DE may have a multi layer structure having a plurality of layers including materials different each other. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material including silicon oxide (SiOx) or silicon nitride (SiNx).

The organic layer 140 is disposed on the second insulation layer 130. The organic layer 140 planarizes an upper surface of the substrate so that problems due to the step such as disconnection of a signal line may be prevented. The organic layer 140 may be an insulation layer including an organic material. The organic layer 140 may be a color filter.

The test pattern TPE may be a pixel electrode. The pixel electrode is formed on the organic layer 140. The pixel electrode may be electrically connected with the drain electrode DE through a first contact hole CNT1. The pixel electrode may include a transparent conductive material, such as indium tin oxide (ITO) and indium zinc oxide (IZO). In addition, the pixel electrode may include titanium (Ti) and/or molybdenum titanium (MoTi). The pixel electrode may be electrically connected with the drain electrode DE.

After the test pattern TPE is formed, a first alignment value of the test pattern with respect to the first pattern is measured. For example, the first pattern may be the gate electrode GE, and the test pattern TPE may be a pixel electrode. Thus, a first alignment value AV1 of the test pattern TPE with respect to the gate electrode GE is measured. For example, the first alignment value AV1 may be measured using the measuring part 300. The first alignment value AV1 is a distance from an end of the gate electrode GE to an end of the test pattern TPE.

After the first alignment value AV1 is measured, a second alignment value AV2 of the test pattern TPE with respect to the second pattern is measured. For example, the second pattern may be a drain electrode DE, and the test pattern TPE may be a pixel electrode. Thus, a second alignment value AV2 of the test pattern TPE with respect to the drain electrode DE is measured. The second alignment value AV2 is a distance from an end of the drain electrode DE to an end of the test pattern TPE.

In the process of generating a second correction data by using the first alignment value AV1 and a second alignment value AV2 5640, the second correction data is generated by using the first alignment value AV1 and the second alignment value AV2.

In an exemplary embodiment of the inventive concept, the second correction data is defined by the following Equation 1.

$$D2 = A \times DV1 + (1-A) \times DV2 \quad \text{(Equation 1)}$$

The parameter D2 is the second correction data, the parameter DV1 is a first correction value of the test pattern with respect to the first pattern and the parameter DV2 is a second correction value of the test pattern with respect to the second pattern.

The first correction value DV1 may be calculated by using a difference between a target alignment value of the third pattern with respect to the first pattern and an alignment value of the test pattern with respect to the first pattern. In addition, the second correction value DV2 may be calculated by using a difference between a target alignment value of the third pattern with respect to the second pattern and an alignment value of the test pattern with respect to the second pattern.

The target alignment value of the third pattern with respect to the first pattern is a design value of the third pattern with respect to the first pattern. In addition, the target alignment value of the third pattern with respect to the second pattern is a design value of the third pattern with respect to the second pattern.

Thus, the first correction value DV1 may be calculated by using a difference between a target alignment value of the third pattern with respect to the first pattern and an alignment value of the test pattern with respect to the first pattern. For example, when the difference between a target alignment value of the third pattern with respect to the first pattern and an alignment value of the test pattern with respect to the first pattern has a "+" value, the first correction value has a "−" value. In addition, when the difference between a target alignment value of the third pattern with respect to the first pattern and an alignment value of the test pattern with respect to the first pattern has a "−" value, the first correction value has a "+" value.

In addition, the second correction value DV1 may be calculated by using a difference between a target alignment value of the third pattern with respect to the second pattern and an alignment value of the test pattern with respect to the second pattern. For example, when the difference between a target alignment value of the third pattern with respect to the second pattern and an alignment value of the test pattern with respect to the second pattern has a "+" value, the second correction value has a "−" value. In addition, when the difference between a target alignment value of the third pattern with respect to the second pattern and an alignment value of the test pattern with respect to the second pattern has a "−" value, the second correction value has a "+" value.

The second correction data D2 may be a value from the first correction value DV1 to the second correction value DV2. For example, the second correction data D2 may be equal to the first correction value DV1, equal to the second correction value DV2, or a value in between the first correction value DV1 and the second correction value DV2. The "A" of the Equation 1 is a numerical variable. The "A" may be determined according to the importance between the alignment value of the third pattern with respect to the first pattern and the alignment value of the third pattern with respect to the second pattern. In an exemplary embodiment, the "A" is more than 0 and less than 1. In another exemplary embodiment, the "A" is 0.5.

When a second pattern disposed on a second layer and a third pattern disposed on a third layer are formed based on a first pattern disposed on a first layer, the third pattern may not be aligned with the second pattern. However, in an exemplary embodiment, the second correction data D2 is a value from the first correction value DV1 to the second correction value DV2. Thus, when a plurality of patterns are disposed on a plurality of layers, each pattern disposed on each layer may be aligned precisely with each other. Accordingly, all patterns may be aligned more precisely, and thus defects of a display device may be decreased.

After the second correction data D2 is generated, the second correction data D2 is stored in the data storage part 400. Thereafter, a third pattern is formed by using the second correction data D2.

Figure 6:
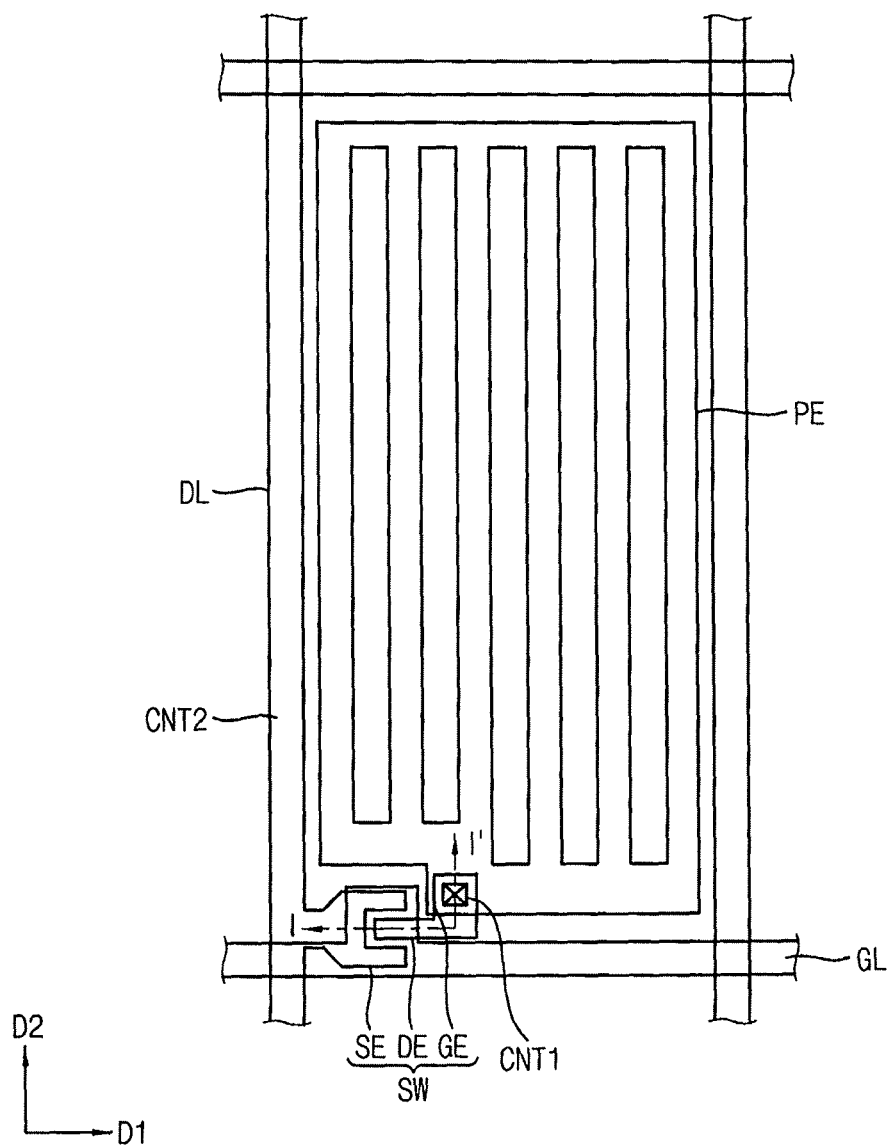
FIG. 6 is a plan view illustrating a display substrate according to an exemplary embodiment of the inventive concept.
Figure 7:
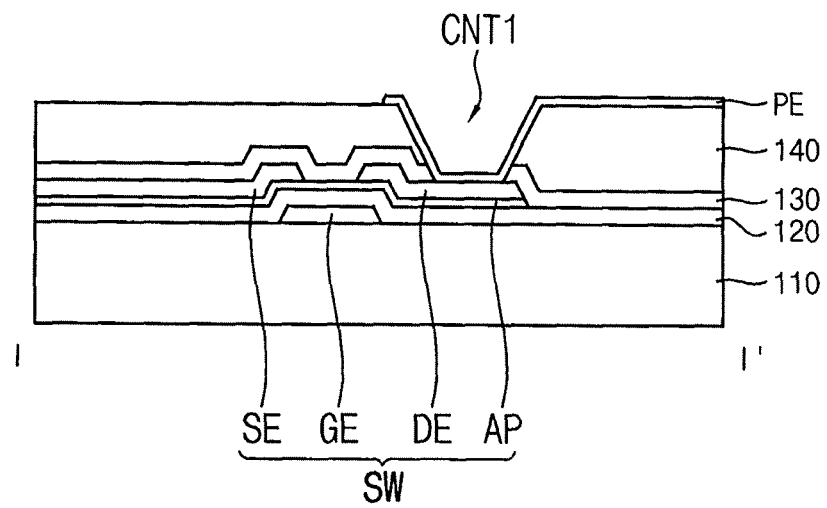
FIG. 7 is a cross-sectional view taken along the line I-I' of FIG. 6.

FIG. 6 is a plan view illustrating a display substrate according to an exemplary embodiment of the inventive concept. FIG. 7 is a cross-sectional view taken along the line I-I' of FIG. 6.

Referring to FIGS. 6 and 7, a display substrate 100 according to an exemplary embodiment of the inventive concept includes a base substrate 110, a gate line GL, a data line DL, a gate electrode GE, a source electrode SE, a drain electrode DE, an active pattern AP, a pixel electrode PE, a first insulation layer 120, a second insulation layer 130 and an organic layer 140.

Examples of the base substrate 110 may include a glass substrate, a quartz substrate, a silicon substrate, a plastic substrate and the like.

The gate line GL is disposed on the base substrate 110. The gate line GL extends in a first direction D1. The gate line GL may have a single layer structure including copper (Cu), silver (Ag), chrome (Cr), molybdenum (Mo), aluminum (Al), titanium (Ti), manganese (Mn) and a mixture thereof. In addition, the gate line GL may have a multi layer structure having a plurality of layers including materials different each other. For example, the gate line GL may include a copper layer and a titanium layer disposed on and/or under the copper layer.

The gate electrode GE is disposed on the base substrate 110. The gate electrode GE electrically connected with the gate line GL. The gate electrode GE may have a single layer structure including copper (Cu), silver (Ag), chrome (Cr), molybdenum (Mo), aluminum (Al), titanium (Ti), manganese (Mn) and a mixture thereof. In addition, the gate electrode GE may have a multi layer structure having a plurality of layers including materials different each other. For example, the gate electrode GE may include a copper layer and a titanium layer disposed on and/or under the copper layer.

The first insulation layer 120 is formed on the gate electrode GE. The first insulation layer 120 may cover the base substrate 110 and a first conductive pattern including the gate electrode GE. The first insulation layer 120 may include an inorganic material such as silicon oxide (SiOx) and/or silicon nitride (SiNx). For example, the first insulation layer 120 includes silicon oxide (SiOx), and may have a thickness of about 500 Å. In addition, the first insulation layer 120 may include a plurality of layers including different materials from each other.

An active pattern AP is formed on the first insulation layer 120. The active pattern AP is formed on the first insulation layer 120 in an area in which the gate electrode GE is formed. The active pattern AP may be overlapped with the gate electrode GE. The active pattern AP may be partially overlapped with the source electrode SE and the drain electrode DE. The active pattern AP may be disposed between the gate electrode GE and the source electrode SE. The active pattern may be disposed between the gate electrode GE and the drain electrode DE.

The data line DL is formed on the active pattern AP. The data line DL extends in a second direction D2 crossing the first direction D1. The data line DL may be overlapped with a floating electrode. The data line DL may have a recess disposed adjacent to the gate line GL. The data line DL may expose the floating electrode in a plan view. The data line DL may have the same width as the floating electrode. The data line DL may be electrically connected with the floating electrode. The data line DL may be electrically connected with the floating electrode at both ends of the floating electrode. The data line DL may have a single layer structure including copper (Cu), silver (Ag), chrome (Cr), molybdenum (Mo), aluminum (Al), titanium (Ti), manganese (Mn) and a mixture thereof. In addition, the data line DL may have a multi layer structure having a plurality of layers including materials different each other. For example, the data line DL may include a copper layer and a titanium layer disposed on and/or under the copper layer. The data line DL may have a thickness of 6000 Å.

The source electrode SE and the drain electrode DE may be formed on the active pattern AP. The source electrode SE and the drain electrode DE may be spaced apart from each other. The source electrode SE and the drain electrode DE may be formed from the same layer as the data line DL.

The source electrode SE and the drain electrode DE may have a single layer structure including copper (Cu), silver (Ag), chrome (Cr), molybdenum (Mo), aluminum (Al), titanium (Ti), manganese (Mn) and a mixture thereof. In addition, the source electrode SE and the drain electrode DE may have a multi layer structure having a plurality of layers including materials different each other. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material including silicon oxide (SiOx) or silicon nitride (SiNx).

The organic layer 140 is disposed on the second insulation layer 130. The organic layer 140 planarizes an upper surface of the substrate so that problems due to the step such as disconnection of a signal line may be prevented. The organic layer 140 may be an insulation layer including an organic material. The organic layer 140 may a color filter.

The pixel electrode is formed on the organic layer 140. The pixel electrode may be electrically connected with the drain electrode DE through a first contact hole CNT1. The pixel electrode may include a transparent conductive material, such as indium tin oxide (ITO) and indium zinc oxide (IZO). In addition, the pixel electrode may include titanium (Ti) and/or molybdenum titanium (MoTi). The pixel electrode may be electrically connected with the drain electrode DE.

FIGS. 9 to 12 are cross-sectional views illustrating a method of manufacturing the display substrate of FIG. 7 according to an exemplary of the inventive concept.

Figure 9:
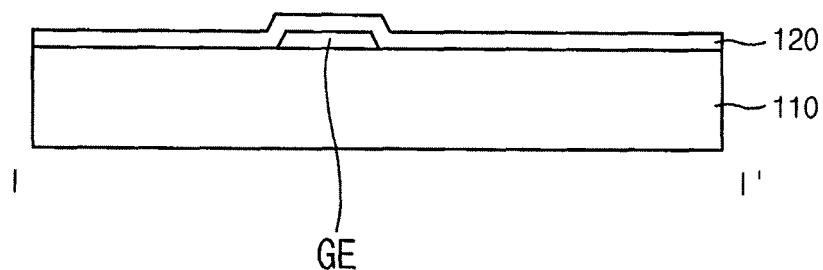

Referring to FIG. 9, the gate electrode GE is formed on the base substrate 110. Thereafter, the first insulation layer 120 is formed on the base substrate 110 on which the gate electrode GE is formed.

The gate electrode GE may be formed by patterning a first conductive layer. The first conductive layer may be formed through a sputtering process. For example, sputtering may include a process where atoms are ejected from a solid target material due to bombardment of the target by energetic particles. The first conductive layer may have a single layer structure including copper (Cu), silver (Ag), chrome (Cr), molybdenum (Mo), aluminum (Al), titanium (Ti), manganese (Mn) and a mixture thereof. In addition, the first conductive layer may have a multi layer structure having a plurality of layers including materials different each other.

The first conductive layer may be a gate metal layer. In addition, the gate electrode GE may be a gate metal pattern.

A first correction data D1 may be generated by measuring an alignment value of the gate electrode GE. The alignment value of the gate electrode GE may be measured by using alignment patterns formed by the same process as the gate electrode GE. After the first correction data D1 is generated, the first correction data D1 is stored in the data storage part 400.

The first insulation layer 120 is formed on the base substrate 110 on which the gate electrode GE and the floating electrode FE is formed. The first insulation layer 120 may include an inorganic material such as silicon oxide (SiOx) and/or silicon nitride (SiNx). For example, the first insulation layer 120 includes silicon oxide (SiOx), and may have a thickness of about 500 Å. In addition, the first insulation layer 120 may include a plurality of layers including different materials from each other.

Figure 10:
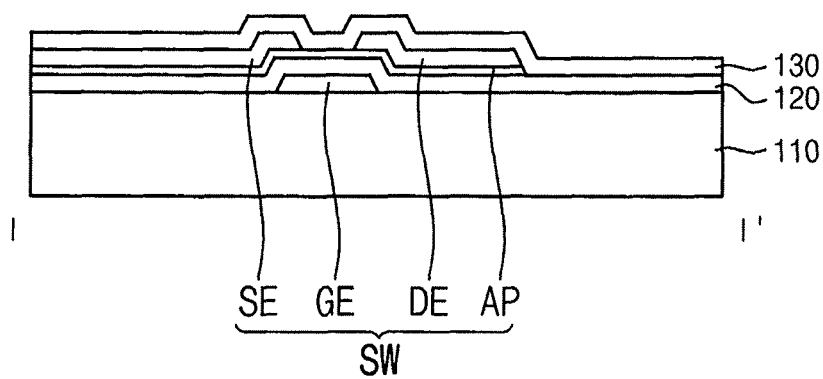

Referring to FIG. 10, the source electrode SE, the drain electrode DE and the data line DL is formed by patterning the second conductive layer. Thereafter, the second insulation layer 130 is formed on the base substrate 110 on which the source electrode SE, the drain electrode DE and the data line DL is formed.

The source electrode SE and the drain electrode DE are formed according to the first correction data D1 stored in the data storage part 400. The first correction data D1 is data for exposing a substrate using the same alignment value as the alignment value of the gate electrode GE to form the source electrode SE and the drain electrode DE. The first correction data D1 may include an alignment value of an X-component value of the gate electrode GE and an alignment value of a Y-component value of the gate electrode GE.

The source electrode SE and the drain electrode DE may have a single layer structure including copper (Cu), silver (Ag), chrome (Cr), molybdenum (Mo), aluminum (Al), titanium (Ti), manganese (Mn) and a mixture thereof. In addition, the source electrode SE and the drain electrode DE may have a multi layer structure having a plurality of layers including materials different each other. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material including silicon oxide (SiOx) or silicon nitride (SiNx).

In an exemplary embodiment, the source electrode SE and the drain electrode DE are formed by using first correction data D1 corresponding to the alignment state of the gate electrode GE. The source electrode SE and the drain electrode DE are formed according to the gate electrode GE. Therefore, although the gate electrode GE is formed misaligned with a mother substrate, the source electrode SE and the drain electrode DE are aligned with the gate electrode GE precisely. Thus, defects of a display device may be decreased.

Figure 11:
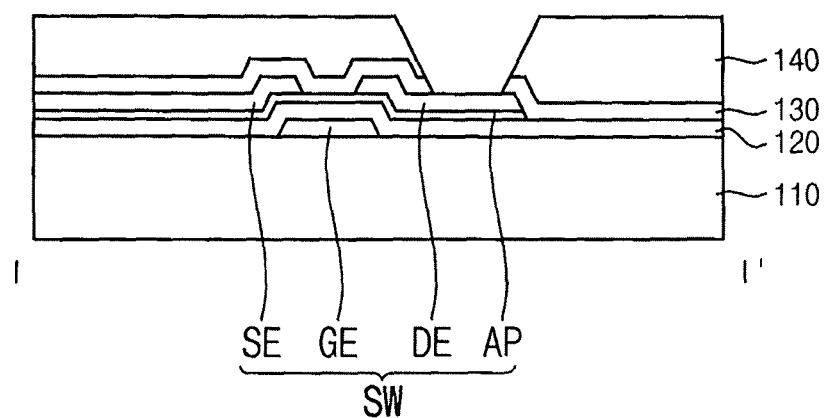

Referring to FIG. 11, the organic layer 140 is disposed on the second insulation layer 130. The organic layer 140 planarizes an upper surface of the substrate so that problems due to the step such as disconnection of a signal line may be prevented. The organic layer 140 may be an insulation layer including an organic material. The organic layer 140 may a color filter.

Thereafter, the first insulation layer 120, the second insulation layer 130 and the organic layer 140 is patterned. Therefore, a first contact hole CNT1 exposing a portion of the drain electrode DE is formed. The first contact hole CNT1 is formed through the organic layer 140 and the second insulation layer 130, so that the first contact hole CNT1 partially exposes the drain electrode DE.

Figure 12:
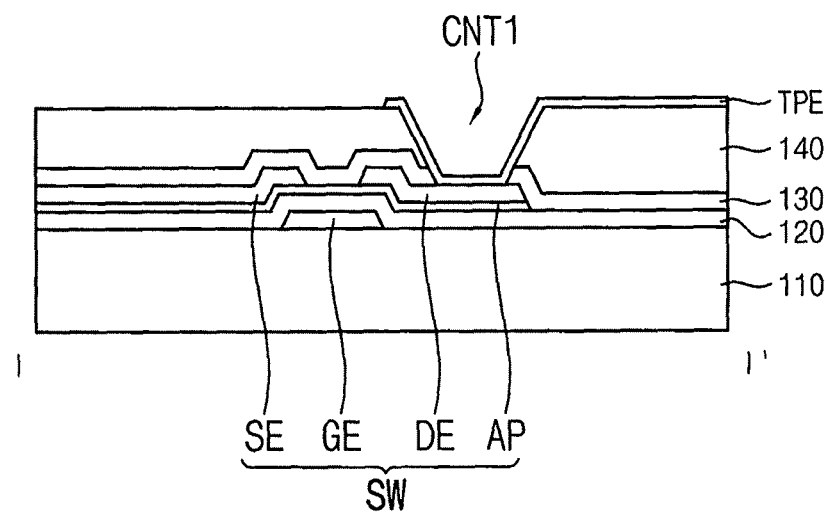

Referring to FIG. 12, a test pattern TPE is formed on the patterned organic layer 140.

The test pattern TPE is the same pattern as the pixel electrode. The test pattern TPE is formed to generate the second correction data D1 for forming the pixel electrode.

Referring to FIG. 8, a method of measuring an alignment value of the test pattern TPE formed on the third layer is illustrated.

After the test pattern TPE is formed, a first alignment value AV1 of the test pattern TPE with respect to the first pattern is measured. For example, the first pattern may be a gate electrode GE, and the test pattern TPE may be a pixel electrode. Thus, a first alignment value AV1 of the test pattern TPE with respect to the gate electrode GE is measured. The first alignment value AV1 is a distance from an end of the gate electrode GE to an end of the test pattern TPE.

After the first alignment value AV1 is measured, a second alignment value AV2 of the test pattern TPE with respect to the second pattern is measured. For example, the second pattern may be a drain electrode DE, and the test pattern TPE may be a pixel electrode. Thus, a second alignment value AV2 of the test pattern TPE with respect to the drain electrode DE is measured. The second alignment value AV2 is a distance from an end of the drain electrode DE to an end of the test pattern TPE.

Thereafter, second correction data D2 is generated by using the first alignment value AV1 and the second alignment value AV2. The second correction data D2 may be defined by the above Equation 1.

The second correction data D2 may be a value from the first correction value DV1 to the second correction value DV2. The parameter "A" of the Equation 1 is a numerical variable. The "A" may be determined according to importance between the alignment value of the third pattern with respect to the first pattern and the alignment value of the third pattern with respect to the second pattern. In an exemplary embodiment, the "A" is more than 0 and less than 1. In another exemplary embodiment, the "A" is 0.5.

When a second pattern disposed on a second layer and a third pattern disposed on a third layer are formed based on a first pattern disposed on a first layer, the third pattern may be not be aligned with the second pattern. However, in an exemplary embodiment, the second correction data is a value from the first correction value D1 to the second correction value D2. Thus, when a plurality of patterns is formed on a plurality of layers, each pattern disposed on each layer may be aligned precisely with each other. Accordingly, all patterns may be aligned precisely, and thus defects of display device may be decreased.

Referring to FIG. 7, the pixel electrode PE is formed on the base substrate 110 on which the organic layer 140 is formed by using the second correction data D2.

The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE. The pixel electrode PE may be electrically connected with the drain electrode DE through the first contact hole CNT1.

According to an exemplary embodiment, a data metal pattern is formed by using a first correction data D1 corresponding to the alignment state of the gate metal pattern. The data metal pattern is formed according to the gate metal pattern. Therefore, although the gate metal pattern is formed with misaligned with a mother substrate, the data metal pattern is aligned with the gate metal pattern precisely. Thus, defects of the display device may be decreased.

In addition, the second correction data D2 may be a value from the first correction value DV1 to the second correction value DV2. Thus, when a plurality of patterns on a plurality of layers, each pattern disposed on each layer may be aligned precisely each other. Accordingly, all patterns may be aligned precisely, and thus defects of the display device may be decreased.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the present invention. Accordingly, all such modifications are intended to be included within the scope of the present invention.

What is claimed is:

1. A method of exposing a substrate, the method comprising:
   exposing a substrate to form a gate electrode together with an alignment pattern on a first layer;
   measuring only the formed alignment pattern to generate a first alignment value;
   generating first correction data by using the first alignment value;
   storing the first correction data; and
   exposing the substrate to form a first pattern on a second layer disposed on the first layer by using the first correction data.

2. The method of claim 1, further comprising:
   generating second correction data;
   storing the second correction data; and
   exposing the substrate to form a second pattern on a third layer disposed on the second layer by using the second correction data.

3. The method of claim 2, wherein generating the second correction data comprises:
   forming a test pattern on the third layer;
   measuring a second alignment value of the test pattern with respect to the gate electrode;
   measuring a third alignment value of the test pattern with respect to the first pattern; and
   generating a second correction data by using the second alignment value and the third alignment value.

4. The method of claim 3, wherein the second correction data is defined by the following Equation, $$D2=A\times DV1+(1-A)\times DV2,$$

wherein the D2 is the second correction data, the DV1 is a first correction value of the test pattern with respect to the gate electrode and the DV2 is a second correction value of the test pattern with respect to the first pattern, and the A is a numerical variable.

5. The method of claim 4, wherein the first correction value is calculated by using a difference between a target alignment value of the second pattern with respect to the gate electrode and an alignment value of the test pattern with respect to the gate electrode, and the second correction value is calculated by using a difference between a target alignment value of the second pattern with respect to the first pattern and an alignment value of the test pattern with respect to the first pattern.

6. The method of claim 1, wherein the gate electrode corresponds to a gate electrode for a liquid crystal display device.

7. The method of claim 1, wherein the substrate is disposed on a stage at a first position prior to the exposing of the substrate to form the gate electrode and the alignment pattern, and the exposing of the substrate to form the first pattern comprises;
   moving the stage to a second position based on the first correction data; and
   applying light to the substrate.

8. The method of claim 1, wherein the first correction data is based on a horizontal width CD1 and a vertical width CD2 of the alignment pattern.

9. The method of claim 8, wherein the alignment pattern has a shape of a frame including an outer rectangle and an inner rectangle.

10. The method of claim 9, wherein the first correction data is based on the horizontal width CD1 and distances between vertical edges of the outer rectangle and the inner rectangle.

11. The method of claim 9, wherein the first correction data is based on the vertical width CD2 and distances between horizontal edges of the outer rectangle and the inner rectangle.

12. A method of manufacturing a display substrate, the method comprising:
   forming a gate electrode on a substrate;
   measuring a first alignment value of the gate electrode;
   generating first correction data by using the first alignment value; and. exposing the substrate to form a data pattern on the substrate by using the first correction data.

13. The method of claim 12, wherein the first alignment value is measured by using an alignment pattern formed by the same process as the gate electrode.

14. The method of claim 12, further comprising:
   generating second correction data;
   storing the second correction data; and
   exposing the substrate to form a pixel electrode on the substrate by using the second correction data.

15. The method of claim 14, wherein generating the second correction data comprises:
   forming a test pattern on the substrate;
   measuring a second alignment value of the test pattern with respect to the gate pattern;
   measuring a third alignment value of the test pattern with respect to the data pattern; and
   generating second correction data by using the second alignment value and the third alignment value.

16. The method of claim 15, wherein the second correction data is defined by the following Equation, $$D2=A\times DV1+(1-A)\times DV2,$$

wherein the D2 is the second correction data, the DV1 is a first correction value of the test pattern with respect to the gate pattern and DV2 is a second correction value of the test pattern with respect to the data pattern, wherein the. A is a numerical variable.

17. A method of manufacturing a display substrate, the method comprising:
   forming a gate electrode on a substrate;
   determining, by a measuring part attached to an exposure device, a first alignment value indicating a degree of alignment between the gate electrode and an alignment pattern on the substrate;

generating first correction data from the first alignment value; and adjusting the exposure device to apply light to the substrate using the first correction data to generate a drain electrode on the substrate.

18. The method of claim 17, further comprising:

forming a test pattern on the substrate;

determining, by the measuring part, a second alignment value indicating a degree of alignment between the test pattern and the gate electrode;

determining, by the measuring part, a third alignment value indicating a degree of alignment between the test pattern and the drain electrode;

generating second correction data by using the second alignment value and the third alignment value; and adjusting the exposure device using the second correction data to generate a pixel electrode on the substrate.

* * * * *